United States Patent [19]
Leak et al.

[11] Patent Number: 5,937,424
[45] Date of Patent: Aug. 10, 1999

[54] METHOD AND APPARATUS FOR SUSPENDING THE WRITING OF A NONVOLATILE SEMICONDUCTOR MEMORY WITH PROGRAM SUSPEND COMMAND

[75] Inventors: David A. Leak, Rancho Cordova; Fasil G. Bekele, San Francisco; Thomas C. Price, Fair Oaks; Alan E. Baker, Granite Bay; Charles W. Brown, Folsom; Peter K. Hazen, Auburn; Vishram Prakash Dalvi, Fair Oaks; Rodney R. Rozman, Placerville; Christopher John Haid, Folsom; Jerry Kreifels, El Dorado Hills, all of Calif.

[73] Assignee: Intel Corporation, Santa Clara, Calif.

[21] Appl. No.: 08/807,385

[22] Filed: Feb. 27, 1997

Related U.S. Application Data

[63] Continuation-in-part of application No. 08/718,216, Sep. 20, 1996.

[51] Int. Cl.[6] ............................. G06F 12/00; G11C 11/34
[52] U.S. Cl. ............................. 711/103; 711/2; 711/154; 365/185.11; 365/185.29; 365/185.33; 365/218
[58] Field of Search ........................ 711/2, 100, 103, 711/154, 169, 166, 167; 365/185.11, 185.29, 185.33, 218

[56] References Cited

U.S. PATENT DOCUMENTS

| | | | |
|---|---|---|---|
| 4,965,828 | 10/1990 | Ergott, Jr. et al. ...................... | 711/103 |
| 5,021,996 | 6/1991 | Watanabe ............................... | 711/103 |
| 5,255,314 | 10/1993 | Applegate et al. ..................... | 379/212 |
| 5,287,469 | 2/1994 | Tsuboi ..................................... | 711/103 |
| 5,351,216 | 9/1994 | Salt et al. ........................... | 365/230.01 |
| 5,355,464 | 10/1994 | Fandrich et al. ....................... | 365/218 |
| 5,369,754 | 11/1994 | Fandrich et al. ....................... | 711/103 |
| 5,377,145 | 12/1994 | Kynett et al. ..................... | 365/189.05 |
| 5,414,829 | 5/1995 | Fandrich et al. ....................... | 365/218 |
| 5,418,752 | 5/1995 | Harari et al. .......................... | 365/218 |
| 5,422,843 | 6/1995 | Yamada .................................. | 365/218 |
| 5,424,992 | 6/1995 | Coffman et al. ....................... | 365/218 |
| 5,424,993 | 6/1995 | Lee et al. .............................. | 365/218 |
| 5,521,864 | 5/1996 | Kobayashi et al. ................ | 365/185.22 |
| 5,568,644 | 10/1996 | Nelson et al. ......................... | 395/741 |
| 5,590,073 | 12/1996 | Arakawa ............................ | 365/185.08 |
| 5,687,121 | 11/1997 | Lee et al. ........................... | 365/185.11 |
| 5,742,787 | 4/1998 | Talreja .................................. | 711/103 |

OTHER PUBLICATIONS

Macronix, Inc. "Memory Data Book," pp. 45–1 to 45–2, 46–1 to 46–35 and 47–1 to 47–2, (1995).

Primary Examiner—John W. Cabeca
Assistant Examiner—Tuan V. Thai
Attorney, Agent, or Firm—Blakely, Sokoloff, Taylor & Zafman

[57] ABSTRACT

A method and apparatus suspend a program operation in a nonvolatile writeable memory. The nonvolatile writeable memory includes a memory array, a command register, and memory array control circuitry. The command register decodes a program suspend command and provides a suspend signal as an output. The memory array control circuitry is coupled to receive the suspend signal from the command register. The memory array control circuitry performs a program operation in which data is written to the memory array. The memory array control circuitry suspends the program operation upon receiving the suspend signal.

16 Claims, 13 Drawing Sheets

METHOD AND APPARATUS FOR SUSPENDING THE WRITING OF A NONVOLATILE SEMICONDUCTOR MEMORY WITH PROGRAM SUSPEND COMMAND

RELATED APPLICATIONS

The present application is a continuation-in-part of U.S. patent application Ser. No. 08/718,216, filed Sep. 20, 1996.

FIELD OF THE INVENTION

The present invention relates to the field of memory devices. More particularly, this invention relates to suspending a program operation in a nonvolatile writeable memory in order to perform other operations in the nonvolatile writeable memory.

BACKGROUND OF THE INVENTION

One type of prior art nonvolatile writeable memory is a flash Erasable and Electrically Programmable Read-Only Memory ("flash EPROM" or "flash memory"). A typical flash EPROM has the same array configuration as a standard Electrically Programmable Read-Only Memory ("EPROM") and can be programmed in a similar fashion as an EPROM. Once programmed, either the entire contents of the flash EPROM or a block of the flash EPROM can be erased by electrical erasure in one relatively rapid operation. An erasing voltage is made available to the sources of all the cells in the flash EPROM or in one block of the flash EPROM. This results in a full array erasure or a block erasure. The flash EPROM or the erased block of the flash EPROM may then be reprogrammed with new data.

Flash EPROMs differ from convention Electrically Erasable Programmable Read-Only Memory ("EEPROMs") with respect to erasure. Conventional EEPROMs typically use a select transistor for individual cell erasure control. Flash EPROMs, on the other hand, typically achieve much higher density with single transistor cells.

For a prior art single bit flash EPROM, a logical "one" means that few, if any, electrons are stored on a floating gate associated with a bit cell. A logical "zero" means that many electrons are stored on the floating gate associated with the bit cell. Erasure of the flash EPROM causes a logical one to be stored in each bit cell. Each single bit cell of the flash EPROM cannot be overwritten from a logical zero to a logical one without a prior erasure. Each single bit cell of that flash EPROM can, however, be written from a logical one to a logical zero, given that this entails simply adding electrons to a floating gate associated with the erased state.

Flash EPROMs may be read, programmed (or written), and erased. For a prior art flash EPROM, a program operation to write a byte of data typically takes on the order of 10 microseconds. Because, however, there is some margin required for guaranteeing that the program operation has properly completed, a maximum program time is specified by the flash EPROM manufacturer. Thus, while the typical program operation may take 10 microseconds, the system may need to wait a maximum program operation time of 100 microseconds in order to guarantee that the program operation performed correctly.

Similarly, for a prior art flash EPROM, an erase operation may take from 300–600 milliseconds in order to erase a 8 kilobyte block of data. However, the flash EPROM may require up to a maximum erase operation time of 3 seconds in order to guarantee that the erase operation of the entire block of data has performed correctly.

Because the erase operation has such a long latency time, a prior art flash EPROM includes an erase suspend command. When an erase suspend command is written to the flash EPROM, the flash EPROM suspends the erase operation that is being performed. Other operations may then be performed on the flash EPROM. Subsequently, when an erase resume command is written to the flash EPROM, the flash EPROM resumes the erase operation from where its operation was suspended due to the erase suspend command. An implementation of the erase suspend circuitry is described in U.S. Pat. No. 5,355,464, entitled Circuitry And Method For Suspending The Automated Erasure Of A Non-Volatile Semiconductor Memory, by Fandrich et al., and issued to the common assignee of this application.

FIG. 1 shows a representation of a prior art flash EPROM 10. The flash EPROM includes a command register 20, memory array control circuitry 40, and memory array 50.

A number of data input/output (I/O) pins 12 are coupled from pins of the flash EPROM to a command register 20. The number of data I/O pins 12 is usually 8 pins or 16 pins, which matches the size of data to be stored to the flash EPROM. The data I/O pins 12 allow commands to be written to the command register 20. For example, for one prior art flash EPROM, the command decoder includes circuitry for decoding the following commands: (1) erase, (2) erase suspend, (3) erase resume, (4) program, (5) read, and (6) read status. A write enable (WE#) pin 30 is coupled to provide an input to the command register 20.

The command register 20 is coupled to memory array control circuitry 40 via signal lines 78a–n. The memory array control circuitry 40 includes a status register 42. The memory array control circuitry 40 also includes read circuitry, row and column decoder circuitry for accessing and providing data to cells in the memory array 50, and a write state machine, which includes program and erase circuitry. The memory array control circuitry 40 provides the appropriate signals to access the memory array 50 for carrying out the commands provided by the command register 20. The memory array control circuitry 40 receives an address input from address pins 44 of the flash EPROM. A command reset signal 48 is coupled from the memory array control circuitry 40 to the command register 20.

The memory array is coupled to provide data to an output multiplexer 60 for providing data to the data I/O pins 12 of the flash EPROM responsive to a read operation. The status register 42 is also coupled to provide data to the output multiplexer 60 for providing status data to the data I/O pins 12 of the flash EPROM responsive to a read status operation. The status register 42 provides information about the current operation being executed by the flash EPROM. The memory array control circuitry 40 controls the output multiplexer 60 based upon the commands provided to it from the command register 20. The memory array control circuitry 40 selects the status register output to pass through the output multiplexer 60 in response to a read status operation, and the memory array control circuitry selects the memory array output to pass through the output multiplexer 60 in response to a read operation.

In a prior art flash EPROM, a Ready/Busy (RY/BY#) pin 62 of the flash EPROM provides a status indicator of whether the flash EPROM is busy or not. The RY/BY# pin is "low" to indicate a busy state, which signifies that the flash EPROM is performing a block erase operation or a byte write operation. The RY/BY# pin is "high" to indicate a ready state, which signifies that the flash EPROM is ready for new commands, block erase is suspended, or the device is in a powerdown mode. The status register 42 is coupled to provide an output to the RY/BY# pin 62.

Additionally, a supply voltage Vcc, ground potential Vss, and a programming voltage Vpp are provided to the flash EPROM 10.

FIG. 2 shows a prior art block diagram of the command register 20 and the memory array control circuitry 40. The command register 20 includes a command decoder 70 and command latches 76a–n. The command latches include an erase latch 76a, an erase suspend latch 76b, an erase resume latch 76c, a program latch 76d, a read latch 76m, and a read status latch 76n.

The command decoder decodes the commands it receives from the data I/O pins 12. Each of the commands are provided to an associated command latch 76a–n via the signal lines 72a–n. The command latches 76a–n latch the command upon assertion of the write enable (WE#) pin 30. The command latches 76a–n provide the decoded command to the memory array control circuitry 40 via the signal lines 78a–n.

The memory array control circuitry includes erase circuitry 90, program circuitry 94, read circuitry 96, and read status circuitry 98. Erase circuitry 90 includes erase suspend circuitry 92. Read status circuitry 98 is coupled to the status register 42.

The erase latch 76a, erase suspend latch 76b, and the erase resume latch 76c are coupled to erase circuitry 90. The erase suspend latch 76b and erase resume latch 76c are coupled to erase suspend circuitry 92 within the erase circuitry 90.

The program latch 76d is coupled to program circuitry 94. The read latch 76m is coupled to read circuitry 96, and the read status latch 76n is coupled to read status circuitry 98.

The memory array control circuitry 40 is coupled to provide one or more command reset signals 48 to the command decoder for clearing the command latches 76a–n. The command decoder uses the command reset signals 48 to clear the command latches 76a–n via command latch reset signals 74a–n. For one implementation, there are individual command latch reset signals 74a–n coupled to each command latch 76a–n. For another implementation, one command latch reset signal is coupled to all of the command latches.

Flash EPROMs can be used to store both code and data. In one prior art usage, code is stored in certain blocks of the flash EPROM, and data is stored in other blocks of the flash EPROM. This allows for erasing one block without disturbing the contents of a different block. Additionally, some flash EPROMs provide for data blocks and code blocks of different sizes.

Although it is possible to store both code and data in a flash EPROM and execute code provided directly from the flash EPROM to a processor, a problem arises when a flash EPROM is used in a system that requires servicing of code fetches. This is due to the long latency times for program operations and erase operations, as was previously discussed. For example, if a processor were performing a program operation to write a byte of data to the flash EPROM, and subsequently the processor requested that the flash EPROM perform a read operation in order to perform a code fetch, i.e., a read of code to get new instructions for the processor to execute, the read operation may be delayed up to 100 microseconds waiting for the program operation to complete. This causes the processor to stall--the processor remains idle until it receives new instructions. Such a delay to read code would be unacceptable in a system that requires code fetches to be performed in less time than the maximum program operation time.

FIG. 3 shows a prior art representation of a system comprising a processor 100, a volatile memory 102, and a flash EPROM 104 coupled together via a bus 108. The volatile memory 102 and the flash EPROM 104, however, could be coupled to the processor 100, via separate buses. The flash EPROM includes both code and data, wherein the code is executable by the processor. The code of the flash EPROM is shadowed, or copied, to the volatile memory, which may be either dynamic random access memory (DRAM) or static random access memory (SRAM). After the code is shadowed in the volatile memory, if the flash EPROM is performing a program operation and the processor generates a code fetch request, then the processor can satisfy the code fetch request by reading the requested code from the volatile memory. The processor does not need to wait for the flash EPROM to finish its program operation in order to perform a code fetch.

This scheme, however, may be expensive if the size of the code stored in the flash EPROM is large, since the DRAM/SRAM would need to be large enough to store the entire code block in order to overcome the program operation latency. One example of a system which might use the configuration shown in FIG. 3 is a personal computer (PC).

FIG. 4 shows a prior art system including a processor 100, a volatile memory 102, a flash EPROM 104, and an EEPROM 106. In this prior art system, the EEPROM 106 stores data and the flash EPROM 104 stores code. The SRAM/DRAM 102 is used for temporarily storing data before providing the data to the EEPROM 106, i.e., the SRAM/DRAM serves as a buffer between the processor and the EEPROM.

FIG. 5 shows another prior art system in which the EEPROM 106 stores code, and the flash EPROM 104 stores data. The SRAM/DRAM 102 is used as a temporary buffer between the processor and the flash EPROM.

Thus, FIGS. 3, 4 and 5 show prior art flash EPROM systems that lack the ability to quickly and easily service a processor's code fetch requests while the flash memory is performing a program operation.

SUMMARY OF THE PRESENT INVENTION

An object of this invention is to provide a capability of suspending a program operation in a nonvolatile writeable memory in order to read code from the nonvolatile writeable memory. A desire of this invention is to use a suspend command to suspend a program operation responsive to an interrupt signal.

A method and apparatus for suspending program operations in a flash memory is described. The flash memory includes a memory array, a command register, and memory array control circuitry. The command register decodes a program suspend command and provides a suspend signal as an output. The memory array control circuitry is coupled to receive the suspend signal from the command register. The memory array control circuitry performs a program operation in which data is written to the memory array. The memory array control circuitry suspends the program operation upon receiving the suspend signal.

Other objects, features, and advantages of the present invention will be apparent from the accompanying drawings and from the detailed description that follows below.

BRIEF DESCRIPTION OF THE DRAWINGS

FIG. 8b shows the contents of the SRAM/DRAM of FIG. 8a.

FIG. 8c shows the contents of the flash EPROM of FIG. 8a.

DETAILED DESCRIPTION

A method and apparatus for suspending a program operation in a nonvolatile writeable memory in order to read code from the nonvolatile writeable memory is described. Although the detailed description describes embodiments using a flash EPROM, the invention may be used with any nonvolatile writeable memory, including, but not limited to EPROMs, EEPROMs, and flash memories, including technologies such as NOR, NAND, AND, Divided bit-line NOR (DINOR), and Ferro-electric Random Access Memory (FRAM).

Figure 1:
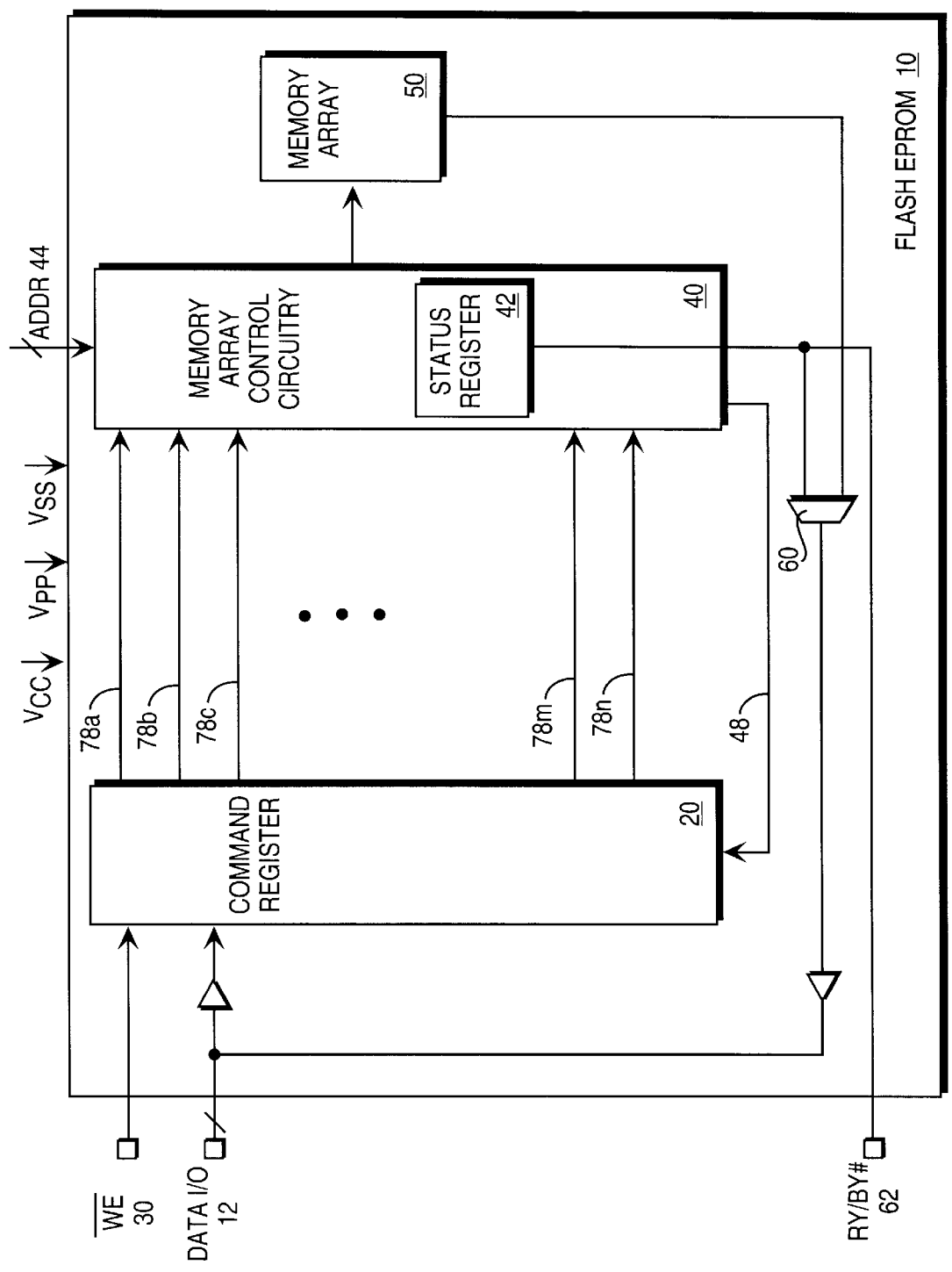
FIG. 1 shows a prior art representation of a flash EPROM.
Figure 2:
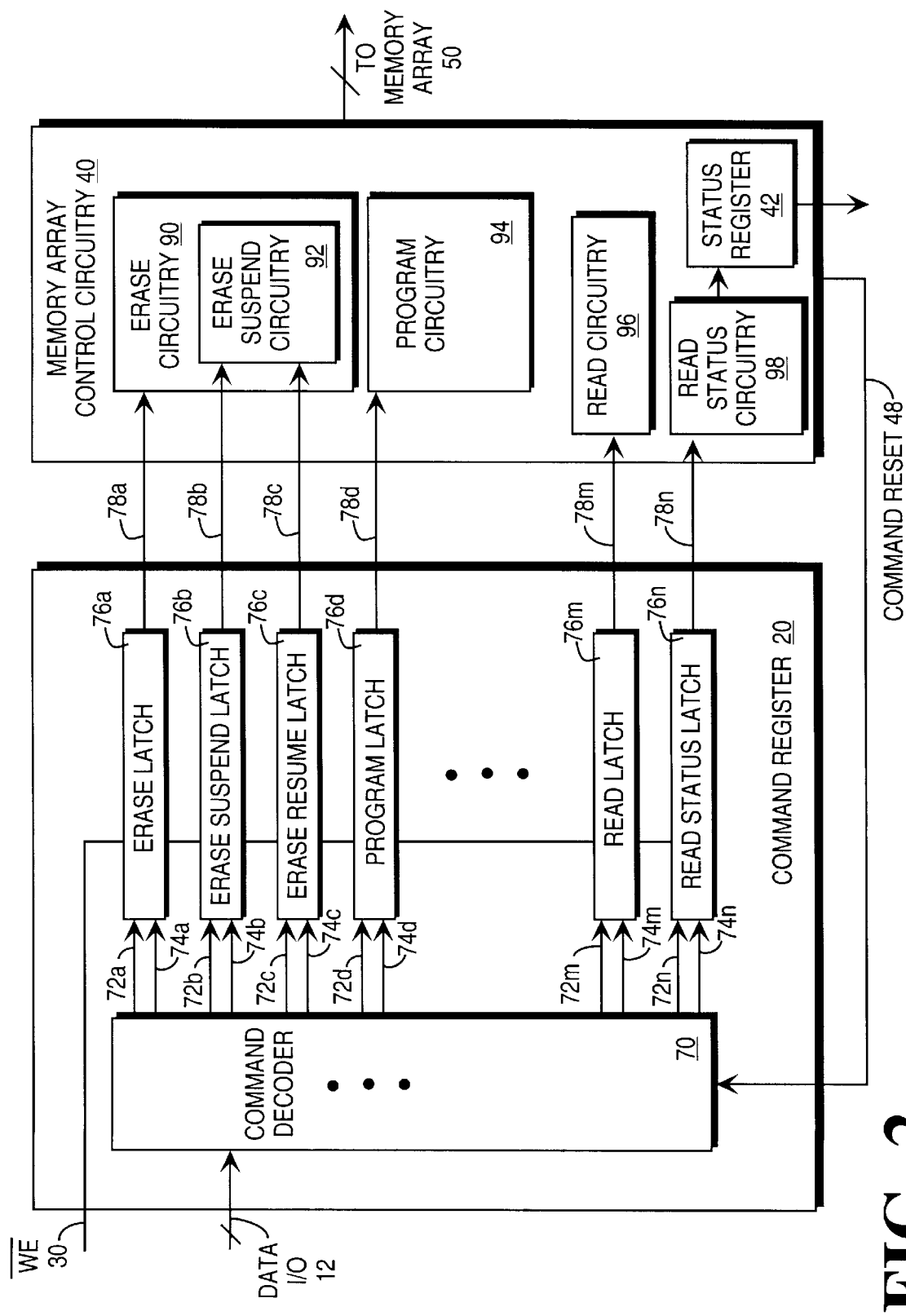
FIG. 2 shows a prior art block diagram of the command register and the memory array control circuitry of the flash EPROM.
Figures 3, 4:
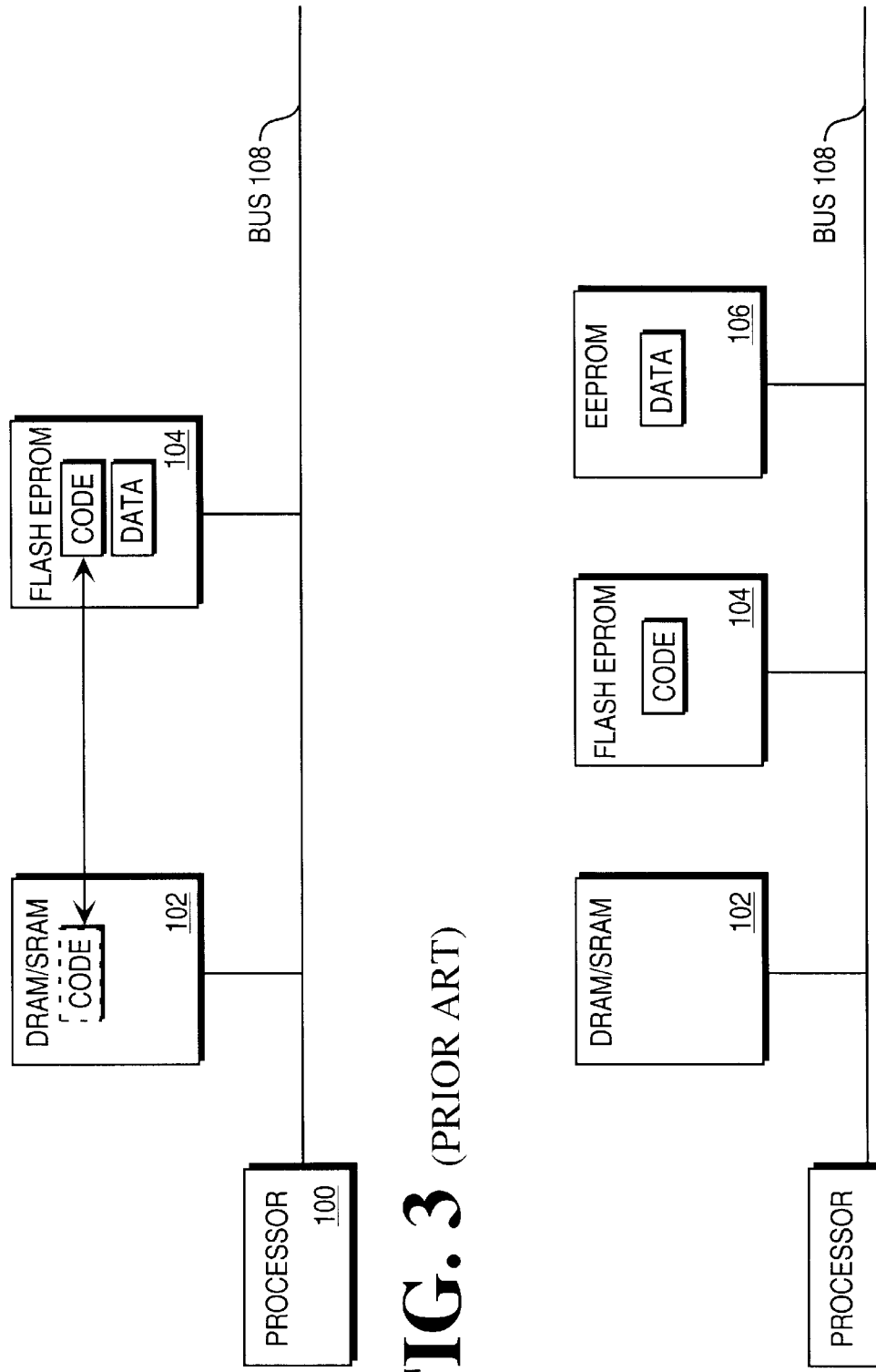
FIG. 3 shows a prior art representation of a system comprising a flash EPROM, a processor and a volatile memory coupled together via a bus.
FIG. 4 shows a prior art system that uses an EEPROM to store data.
Figure 5:
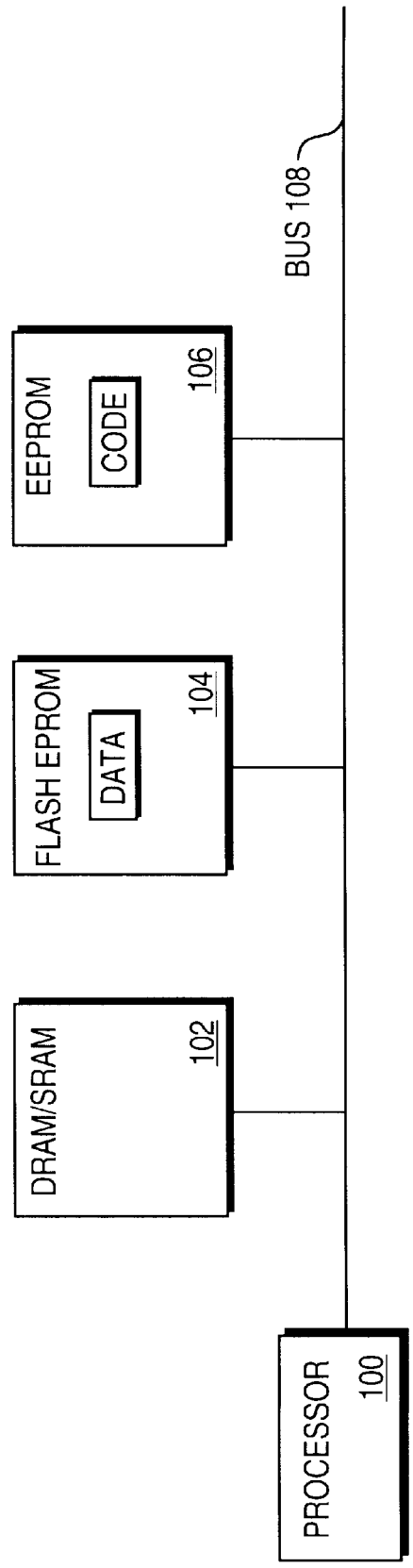
FIG. 5 shows another prior art system which uses an EEPROM to store code.
Figure 6:
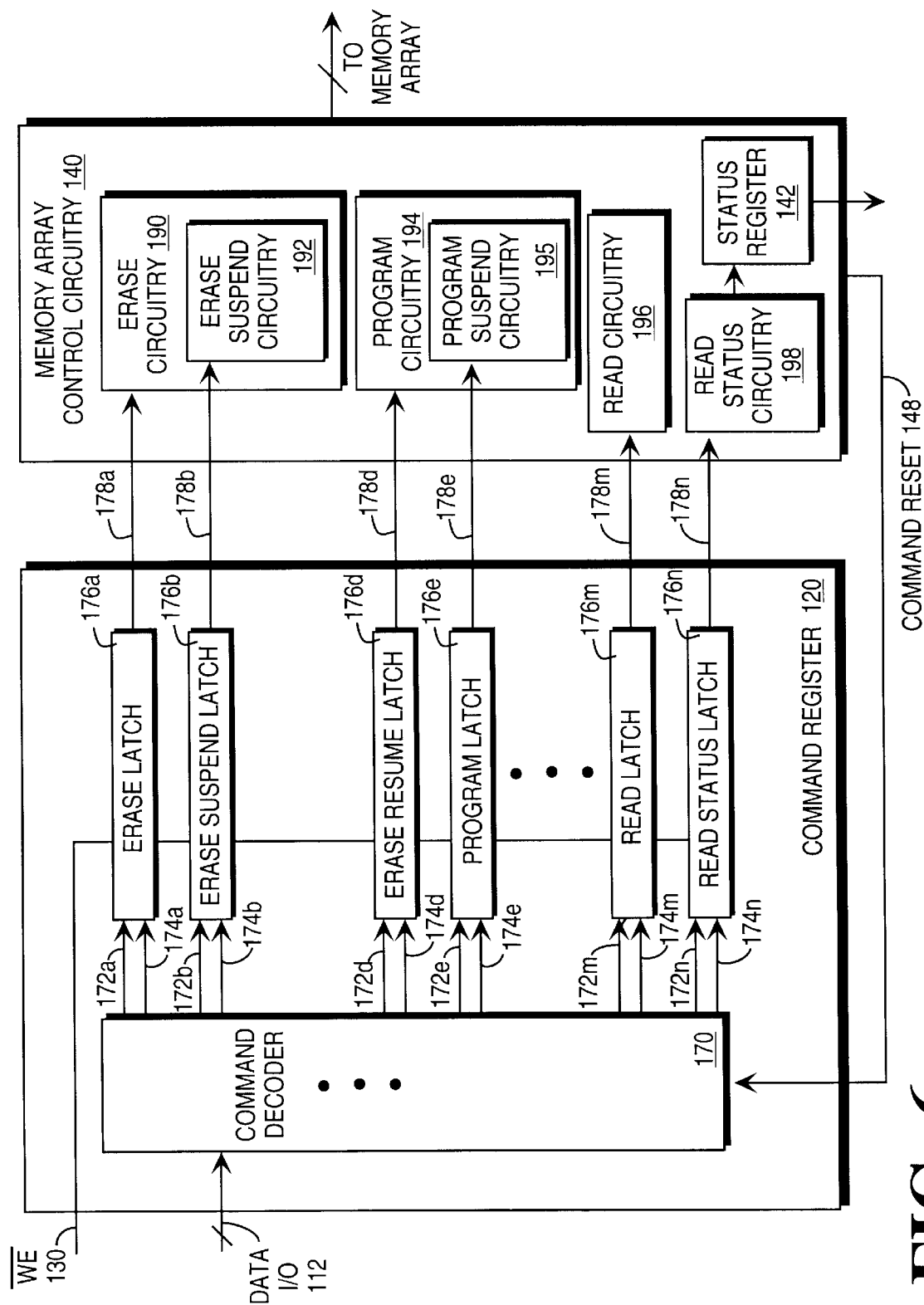
FIG. 6 shows a block diagram of the command register and the memory array control circuitry in accordance with one embodiment of the invention.

FIG. 6 shows a block diagram of the command register 120 and the memory array control circuitry 140 in accordance with one embodiment of the invention.

The command decoder 170 decodes the following commands: (1) erase, (2) erase suspend, (3) erase resume, (4) program, (5) program suspend, (6) program resume, (7) read, and (8) read status. The command decoder provides the decoded command to a corresponding command latch 176a–n via signal lines 172a–n. The command latches are latched using the write enable (WE#) pin 130.

The erase latch 176a is coupled to the erase circuitry 190 via the signal line 178a. The erase suspend latch 176b is coupled to the erase suspend circuitry 192 of the erase circuitry 190 via the signal line 178b.

The program latch 176d is coupled to the program circuitry 194 via the signal line 178d. The program suspend latch 176e is coupled to the program suspend circuitry 195 of the program circuitry 194 via the signal line 178e.

The read latch 176m is coupled to the read circuitry 196 via signal line 178m, and the read status latch 176n is coupled to the read status circuitry 198 via signal line 178n.

The read status circuitry 198 is coupled to status register 142, which is coupled to provide status output to the data I/O and RY/BY# pins.

The memory array control circuitry 140 is coupled to provide one or more command reset signals 148 to the command decoder 170 for clearing the command latches 176a–n. The command decoder uses the command reset signals 148 to clear the command latches 176a–n via command latch reset signals 174a–n. For one embodiment, there are individual command latch reset signals coupled to each command latch 176a–n, so that each command latch 176a–n can be cleared independently. For another embodiment, one command latch reset signal is coupled to all of the command latches.

When a program suspend command is written to the command decoder, the command decoder provides a program suspend command to the program suspend latch 176e. When a program resume command is written to the command decoder, the command decoder 170 clears the program suspend latch 176e by asserting the command latch reset signal 174e.

For one embodiment, the program suspend command and the program resume command are the same command, but are distinguished from each other based on when they occur. Each time the program suspend/program resume command is written to the command decoder, the command decoder toggles between providing a program suspend command to the program suspend latch 176e or clearing the program suspend latch 176e.

For another embodiment, a single suspend command is used for both program suspends and erase suspends. A program suspend command and an erase suspend command are distinguished from each other based on when they occur. If an erase operation is being performed when the suspend command is written to the command decoder, then an erase suspend will be performed. If a program operation is being performed when the suspend command is written to the command decoder, then a program suspend will be performed. Furthermore, the program resume and the erase resume commands can be the same as the program suspend/erase suspend commands. The command decoder 122 keeps track of the last operation that was suspended. When the "suspend-resume" command is written to the command decoder while idle or a non-suspendable operation is being performed, then the last operation that was suspended is resumed. Suspended operations can be nested, as will be described with reference to FIG. 10.

The memory array control circuitry 140 interprets the command signals 178a–n provided to it and performs a corresponding operation in response to the command signals. The memory array control circuitry 140 includes program suspend circuitry 195 for suspending a program operation of the memory array 150. The memory array control circuitry 140 also includes prior art erase suspend circuitry 192 for suspending an erase operation of the memory array 150. The memory array control circuitry includes a means for storing the state of the suspended non-read operation so that the non-read operation can be resumed later. Non-read operations include program operations and erase operations in the following discussion. For an alternate embodiment, however, other types of operations, such as command operations and status retrieving operations, can be suspended.

A program suspend operation completes its suspend of a program operation within a predetermined amount of time to allow a read operation to be performed with a specified latency. The program suspend operation is initiated by writing a program suspend command to the command decoder 170. For one embodiment, the program suspend completes within 7 microseconds. After this predetermined amount of time, other operations can be performed on the flash EPROM.

Similarly, the erase suspend operation completes within a predetermined amount of time. The erase suspend operation may be initiated by the prior art method of writing an erase suspend command to the command decoder 122. For one embodiment, suspending the erase operation completes within 20 microseconds. After this predetermined amount of time, other operations can be performed.

For one embodiment, it is possible to determine whether a program operation or an erase operation is being performed by accessing the status of the flash EPROM using the read status command. Status can also be determined by the RY/BY# pin 162, as was described previously. Alternatively, a separate pin could be used to provide an indication of whether a program operation or whether an erase operation were being performed.

Figure 7A:
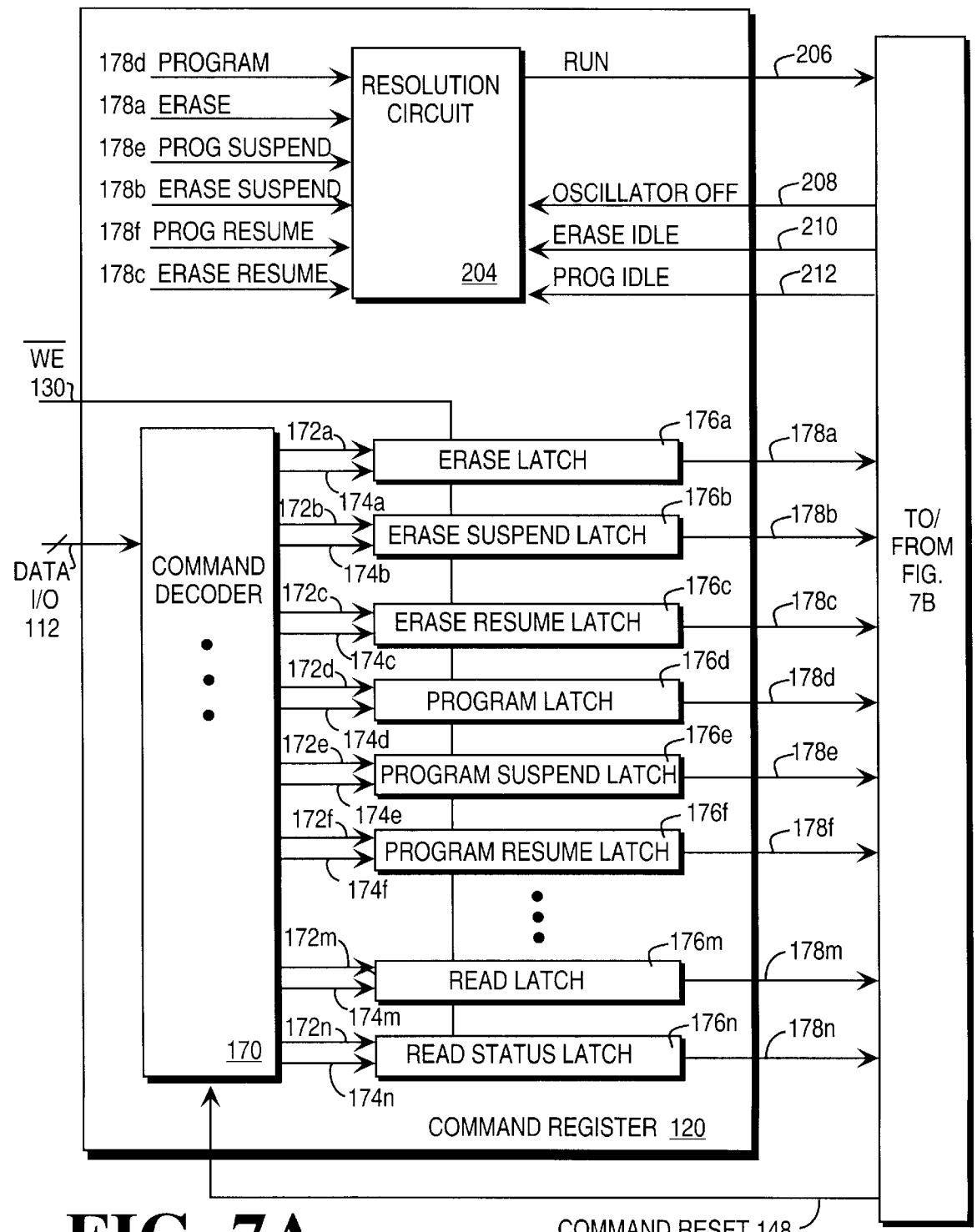
FIGS. 7A and 7B shows a block diagram of another embodiment of the command register and the memory array control circuitry.
Figure 7B:
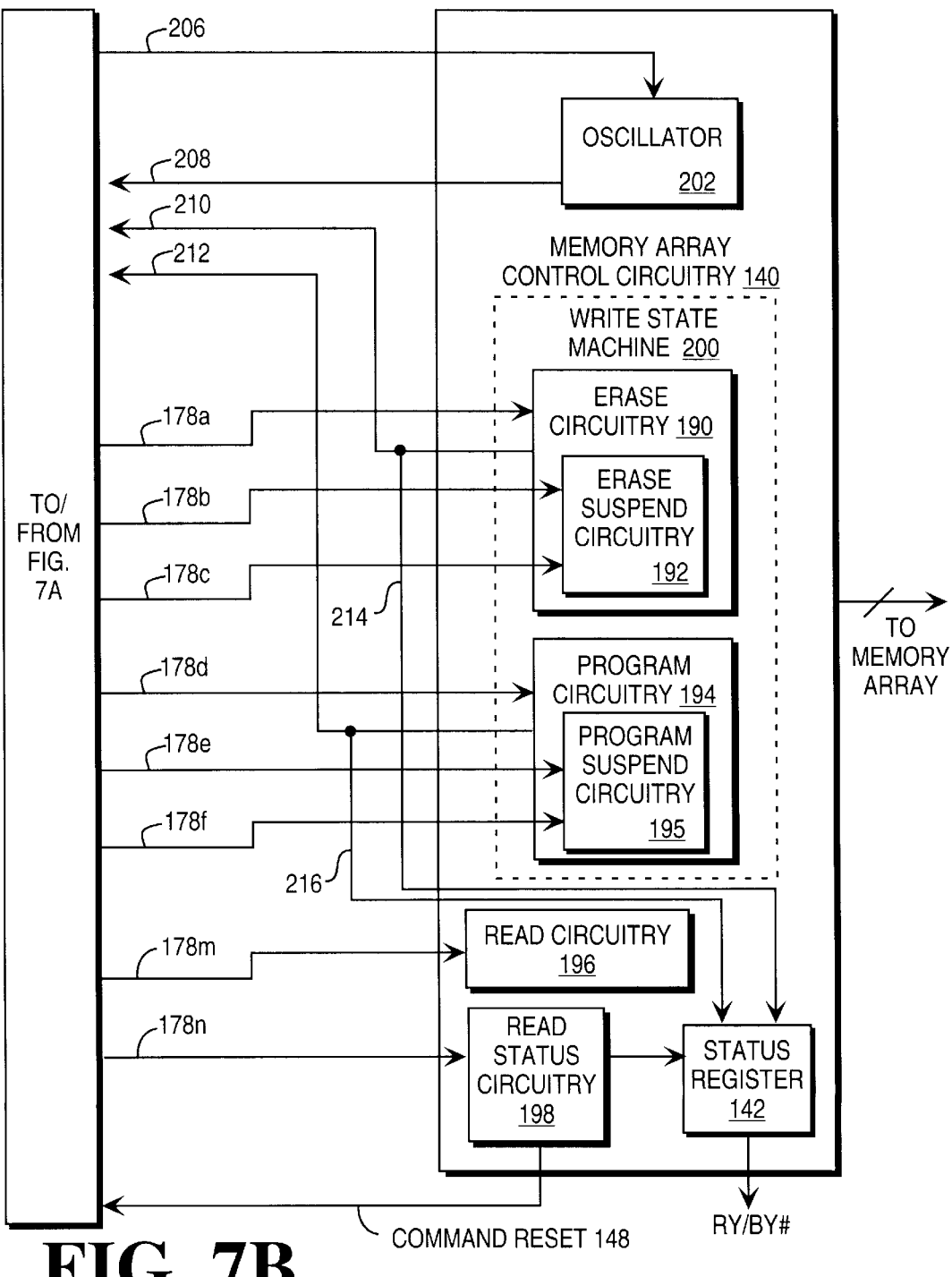

FIGS. 7A and 7B show a block diagram of another embodiment of the command register 120 and the memory array control circuitry 140. The command register 120 of FIGS. 7A and 7B are similar to that of FIG. 6, except that the command decoder of FIGS. 7A and 7B include a erase resume latch 176c and a program resume latch 176e. The erase resume latch 176c is prior art.

The erase resume latch 176c receives a decoded command signal from command decoder 170 via signal line 172c. The erase resume latch 176c is latched upon assertion of the WE# pin 130. The erase resume latch 176c is coupled via signal line 178c to the erase suspend circuitry 192 of the erase circuitry 190. A command latch reset signal 174c is provided from the command decoder 170 to the erase resume latch 176c.

The program resume latch 176f receives a decoded command signal from command decoder 170 via signal line 172f. The program resume latch 176f is latched upon assertion of the WE# pin 130. The program resume latch 176f is coupled via signal line 178f to the program suspend circuitry 195 of the program circuitry 194. A command latch reset signal 174f is provided from the command decoder 170 to the program resume latch 176f.

The program suspend latch 176e provides a signal to the program suspend circuitry 195 in order to suspend a program operation, and the program resume latch 176f provides a signal to the program suspend circuitry 195 in order to resume the suspended program operation.

Figure 8A:
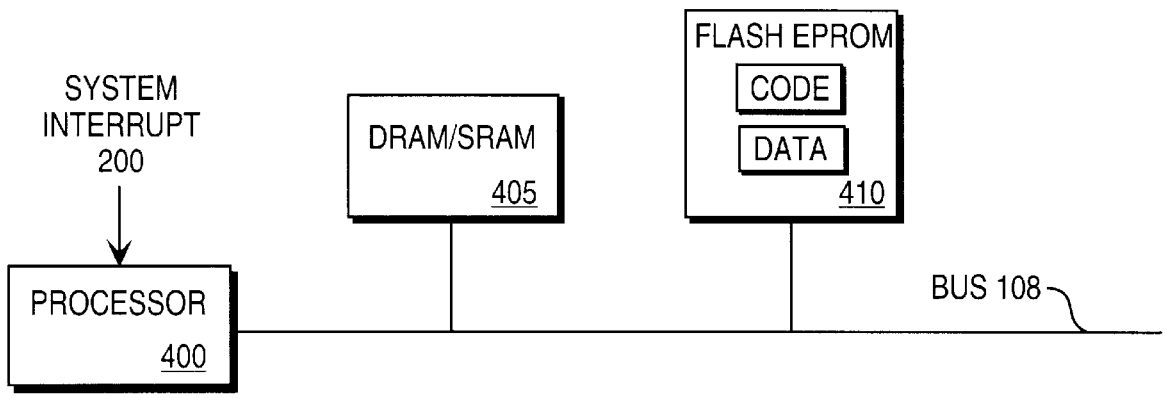
FIG. 8a is a block diagram showing a system including a processor, SRAM/DRAM, and flash EPROM coupled together via a bus.
Figure 8B:
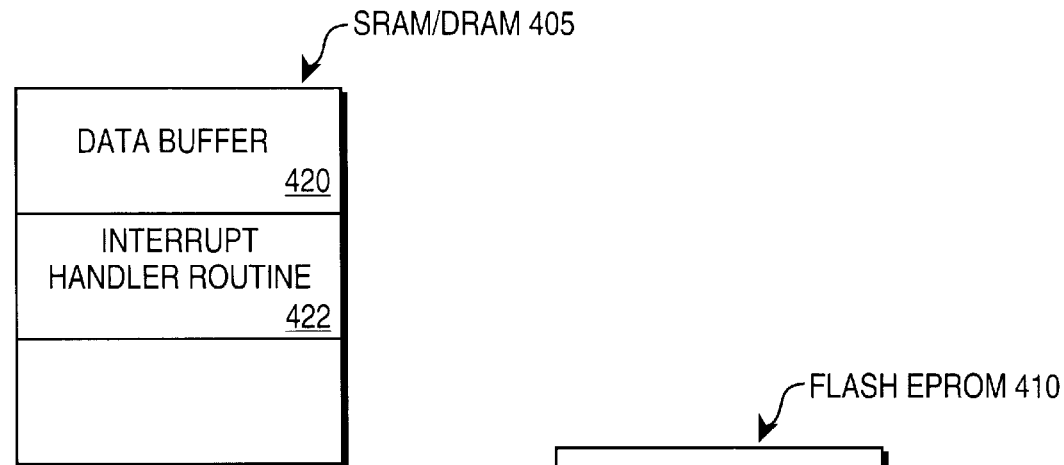
Figure 8C:
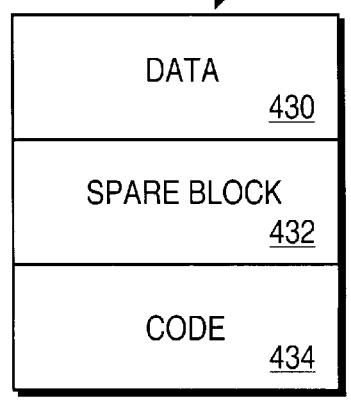

FIG. 8a is a block diagram showing a system including a processor 400, SRAM/DRAM 405, and flash EPROM 410 coupled together via a bus 108. A system interrupt 200 is coupled to provide an input to the processor 400. For another embodiment, the SRAM/DRAM 405 and the flash EPROM 410 are coupled to the processor 400 via different buses. FIG. 8b shows the contents of the SRAM/DRAM 405 of FIG. 8a, and FIG. 8c shows the contents of the flash EPROM 410 of FIG. 8a.

The SRAM/DRAM 405 includes a data buffer storage area 420. This data buffer storage area is used for temporarily storing data prior to storing it in a data area 430 of the flash EPROM 410. The temporary buffer allows the data to be written relatively quickly to the SRAM/DRAM 405, and then transferred to the flash EPROM 410 when there is time to do so.

The SRAM/DRAM 405 also includes an interrupt handler routine 422. The interrupt handler routine 422 provides the processor 400 with code in response to a system interrupt 200.

The flash EPROM 410 includes a data area 430, a spare block area 432, and a code area 434. The spare block area is used for prior art block management. The code area is used to store various routines which are executable by the processor 400.

For one embodiment, the SRAM/DRAM size is 1 Mbit, or 128 KB, and the flash EPROM size is 8 Mbit.

Figure 9:
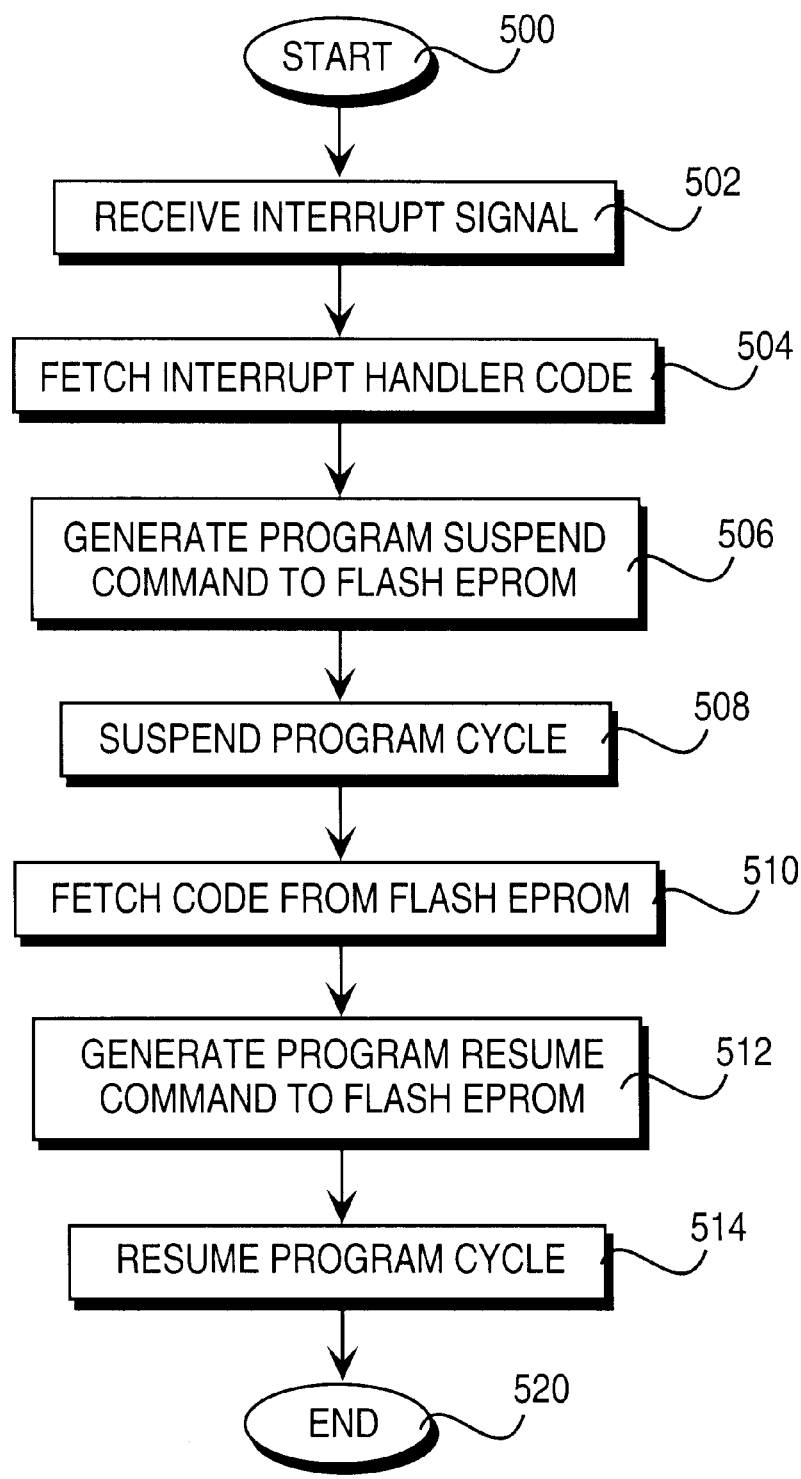
FIG. 9 is a flowchart showing exemplary steps taken by a system having the configuration shown in FIGS. 8a, 8b, and 8c.

FIG. 9 is a flowchart showing exemplary steps taken by a system having the configuration shown in FIGS. 8a, 8b, and 8c. The flowchart begins at block 500 with the processor performing a program operation. From block 500, operation continues at block 502, at which the processor receives a system interrupt signal 200. At block 504, the processor performs a code fetch from the interrupt handler routine 422. For one embodiment, the interrupt handler is stored in the SRAM/DRAM 405. For another embodiment, the interrupt handler is stored within the processor, for example, in a cache or an internal ROM. The interrupt handler routine includes instructions for generating a program suspend command to the flash EPROM 410. The processor 400 executes the interrupt handler routine 422 and generates the program suspend command to the flash EPROM at block 506.

Operation continues at block 508 at which the program operation that was being performed by the flash EPROM is suspended. One or more code fetches are performed from the flash EPROM code area 434 at block 510. Other operations in the flash EPROM are also optionally performed while the program operation is suspended. Operation continues at block 512, at which the processor generates a program resume command to the flash EPROM. The processor 400 generates the program resume command, and at block 514, the program operation is resumed. The flowchart terminates at block 520.

Thus, a method of suspending a program operation using an interrupt handler routine and a program suspend command is described with reference to FIGS. 8a, 8b, 8c, and 9.

Figure 10:
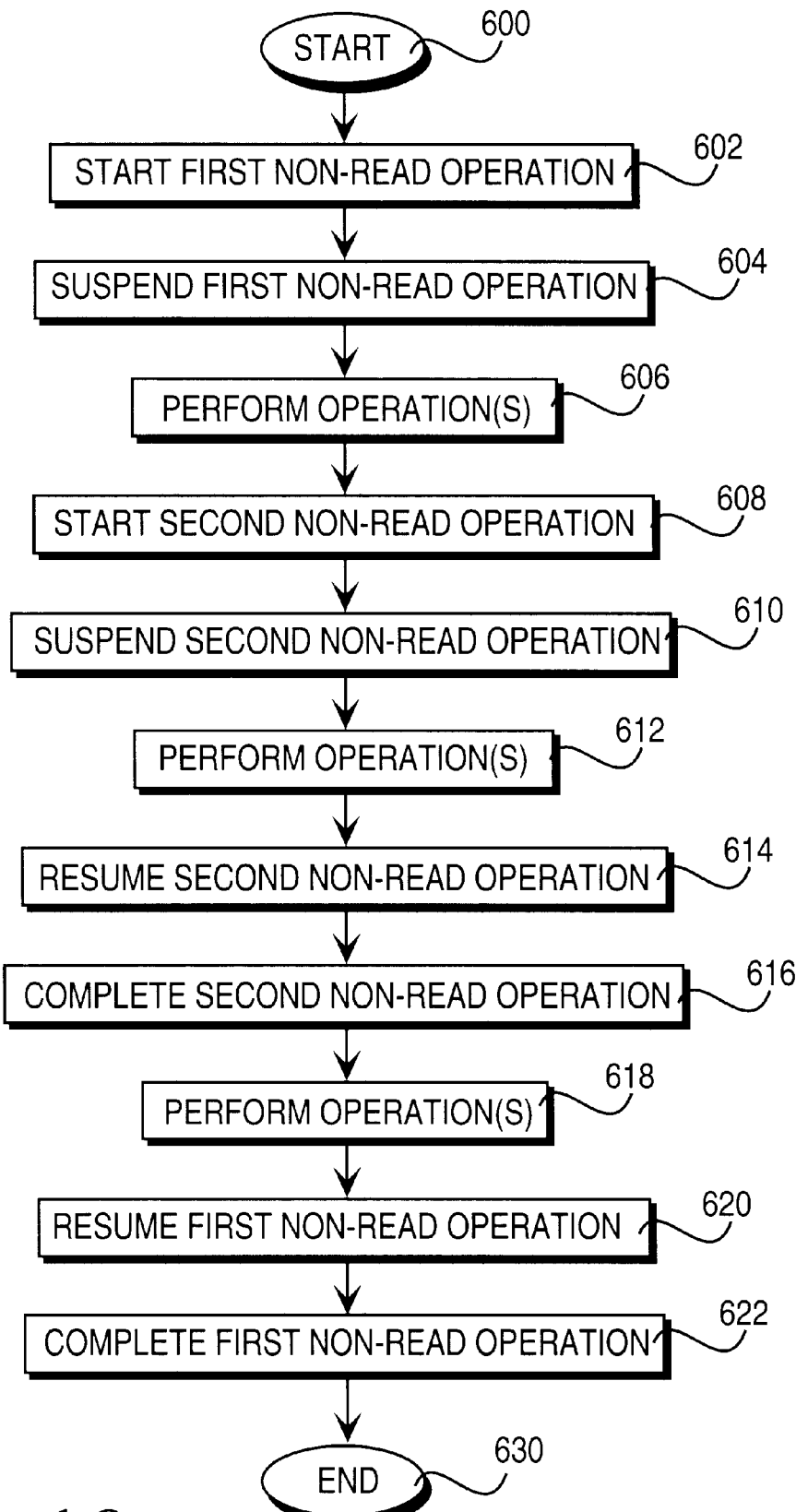
FIG. 10 is flowchart showing that multiple operations may be suspended using a nesting technique.

FIG. 10 is a flowchart showing that multiple operations may be suspended using a nesting technique. The flowchart starts at block 600. Operation continues at block 602, at which a first non-read operation begins. For one embodiment, only the erase operation may be suspended as the first (or outer) nested suspended operation. For this embodiment, the erase operation has a relatively low priority, such that all other operations can preempt it. The program operation has a higher priority, such that only certain operations can preempt it. For another embodiment, the outer nested suspended operation may be an erase operation, a program operation, a read status operation, or a command operation.

At block 604, the first non-read operation is suspended. The suspend is initiated by writing a suspend command to the command decoder 170. The suspended operation is not resumed until operations initiated during the suspended operation have completed. For one embodiment, the RY/BY# signal will transition to a high level to indicate that the flash memory is ready. A bit in the status word accessed via the read status command, however, indicates that an operation is suspended. For one embodiment, the status word includes one bit for indicating that an erase operation is suspended, one bit for indicating that a program operation is suspended, and one bit indicating whether the write state machine is busy.

At block 606, one or more other operations may be performed. For one embodiment, only certain operations are allowed after the first non-read operation is suspended. For example, if an erase operation has been suspended, then only the following operations will be allowed: read, program, program suspend, program resume, read status, and erase resume.

At block 608, a second non-read operation begins. For one embodiment, the second non-read operation is a program operation. The RY/BY# signal transitions to a low level to indicate that the flash memory is busy.

Operation continues at block 610, at which the second non-read operation is suspended. The RY/BY# signal transitions to a high level to indicate that the flash memory is ready.

One or more operations may be performed at block 612. For one embodiment, only certain operations are allowed while a program operation is suspended. For one embodiment, read, read status, and program resume are the only operations allowed.

At block 614, the second non-read operation is resumed. This is accomplished by writing a resume command to the command decoder 170. The steps corresponding to blocks 610–614 may be performed multiple times during the second non-read operation, without limit.

At block 616, the second non-read operation completes. Operation continues at block 618, at which one or more operations may be performed.

At block 620, the first non-read operation is resumed by writing a resume command to the command decoder 170. The steps corresponding to blocks 604–620 may be performed multiple times during the first non-read operation, without limit.

At block 622, the first non-read operation completes. The flowchart terminates at block 630.

With reference to FIGS. 7A and 7B, when suspending multiple operations using the nesting technique of FIG. 10, a requirement exists for conflict resolution between the command decoder 170 and the write state machine 200. The write state machine 200 comprises the erase circuitry 190, the erase suspend circuitry 192, the program circuitry 194, and the program suspend circuitry 195 of the memory array control circuitry 140. The command decoder 170 accepts all commands from the user and the write state machine 200 communicates with the command decoder 170 in order to determine which commands to execute. The command decoder 170 and the write state machine 200 run independently and asynchronously of each other. The conflict may arise between the command decoder 170 and the write state machine 200 because the user has the power to issue suspend and resume commands at any time irrespective of the state of the write state machine 200.

Conflict resolution between the command decoder 170 and the write state machine 200 is handled by the resolution circuit 204 of the command register 120. The resolution circuit 204 monitors select signals of the command decoder 170 and the write state machine 200. The command decoder 170 has priority in terms of deciding when the write state machine 200 should continue executing instructions. The write state machine 200 has priority in terms of suspending write state machine 200 operations upon completion of instruction execution. The decision on whether or not to resume operation of the write state machine 200 is therefore made in the resolution circuit 204. As a result of signals input into the resolution circuit 204 from the command decoder 170 and the write state machine 200, the resolution circuit 204 issues a run signal 206 to the oscillator 202 of the write state machine 200 thereby controlling operation of the write state machine 200. In one embodiment, the command decoder 170 signals monitored by the resolution circuit 204 include program 178d, erase 178a, program suspend 178e, erase suspend 178b, program resume 178f, and erase resume 178c signals. The write state machine 200 signals monitored by the resolution circuit 204 include program idle 212, erase idle 210, and oscillator off 208 signals.

A typical operation of one embodiment of the command register 120 and the memory array control circuitry 140 illustrates conflict resolution by the resolution circuit 204. The operation described herein details operation when the user issues a program command. The same description applies, however, when the user issues an erase command.

When a user issues a program command to the command decoder 170, this causes the program signal 178d to be asserted. When the program signal 178d is asserted, the command decoder 170 causes the resolution circuit 204 to assert the run signal 206 which activates the oscillator 202 of the memory array control circuitry 140, thereby turning the write state machine 200 on.

Upon activation, the write state machine 200 first polls the program signal 178d and the erase signal 178a in order to determine which is asserted. As the program command was issued in this example, the program signal 178d will be asserted, and the write state machine 200 will execute the program algorithm. While the program algorithm is executing in the write state machine 200, the user issues a program suspend command causing the command decoder program suspend signal 176e to be asserted. As the write state machine 200 is executing instructions, it polls at specified intervals for a program suspend signal 178e. When the write state machine 200 detects a program suspend signal 178e, the write state machine 200 ceases execution of the program algorithm instructions, shuts down the memory array control circuitry 140, and asserts the program idle signal 212.

For an alternate embodiment, the program suspend command and the erase suspend command are the same command, but are distinguished from each other based on when they occur. In this situation, as the write state machine 200 is executing instructions, it polls at specified intervals for a suspend command. When the write state machine 200 detects a suspend command, the write state machine 200 ceases execution of its current instructions, shuts down the memory array control circuitry 140, and asserts either an erase idle signal 210 or a program idle signal 212 depending on which algorithm was running at the time the suspend command was received.

If while the write state machine 200 is in the process of suspending operations the user issues a program resume command, then a conflict occurs because the command decoder 170 wants the write state machine 200 to continue executing instructions and the write state machine 200 wants to suspend operations. To resolve this conflict, the resolution circuit 204 polls the program idle signal 212 because the resolution circuit 204 knows that the write state machine 200 is running a program algorithm because the program signal 178d is asserted. If the write state machine 200 were running an erase algorithm, the erase signal 178a would be asserted and the resolution circuit 204 would poll the erase idle signal 210. When program idle 212 is asserted it signals the resolution circuit 204 that the write state machine 200 is suspending an operation that is incomplete. Therefore, since the write state machine 200 is trying to suspend, the resolution circuit 204 determines that this is the correct time to resume because only a suspended operation can be resumed. Consequently, the resolution circuit 204 will override the write state machine oscillator 202 and prevent the write state machine 200 from suspending program execution. When the write state machine oscillator 202 is reactivated by the resolution circuit 204, it detects that the program signal 178d is still asserted which signals the write state machine 200 that this is not a new program and that the write state machine 200 is to return to the suspended program, as indicated by internal flags.

Conflict also arises when, as it oftentimes happens, a suspend command is issued too late in an instruction execution cycle for the write state machine 200 to suspend instruction execution before execution is completed. In this case the write state machine 200 completes instruction execution and shuts down, and no idle signal is asserted. When a resume command is later issued by the user who did not know that the write state machine 200 completed the instruction, the program signal 178d or erase signal 178a is asserted but a corresponding idle signal is not asserted. Therefore, the resolution circuit 204 lets the write state machine 200 shut off because instruction execution has been completed.

When utilizing nested commands, the resolution circuit 204 is necessary in order to prevent a user from resuming a particular command without having first suspended that particular command. As an example, assume an erase command is issued and then suspended. This causes the erase 178a and erase idle signals 210 to be asserted. Next, the user issues a program command. The user immediately suspends the program command, but it is too late in the program instruction execution cycle to suspend, so the write state machine 200 completes the instruction. The user now issues a resume command which is meant to resume the program operation. Without the resolution circuit 204, the resume command meant for the program operation would resume the erase operation.

This situation is avoided because the resolution circuit 204 only polls signals involving the most recently issued user command so as to prevent a user from resuming a particular command without having suspended that particular command. Therefore, the issuance of the program command will cause the resolution circuit 204 to disregard the erase 178a and erase idle signals 210 and only poll the program 178d and program idle signals 212 in the event of a resume signal. This prevents confusing a resume command for a completed operation with a resume command for a suspended operation.

Figure 11A:
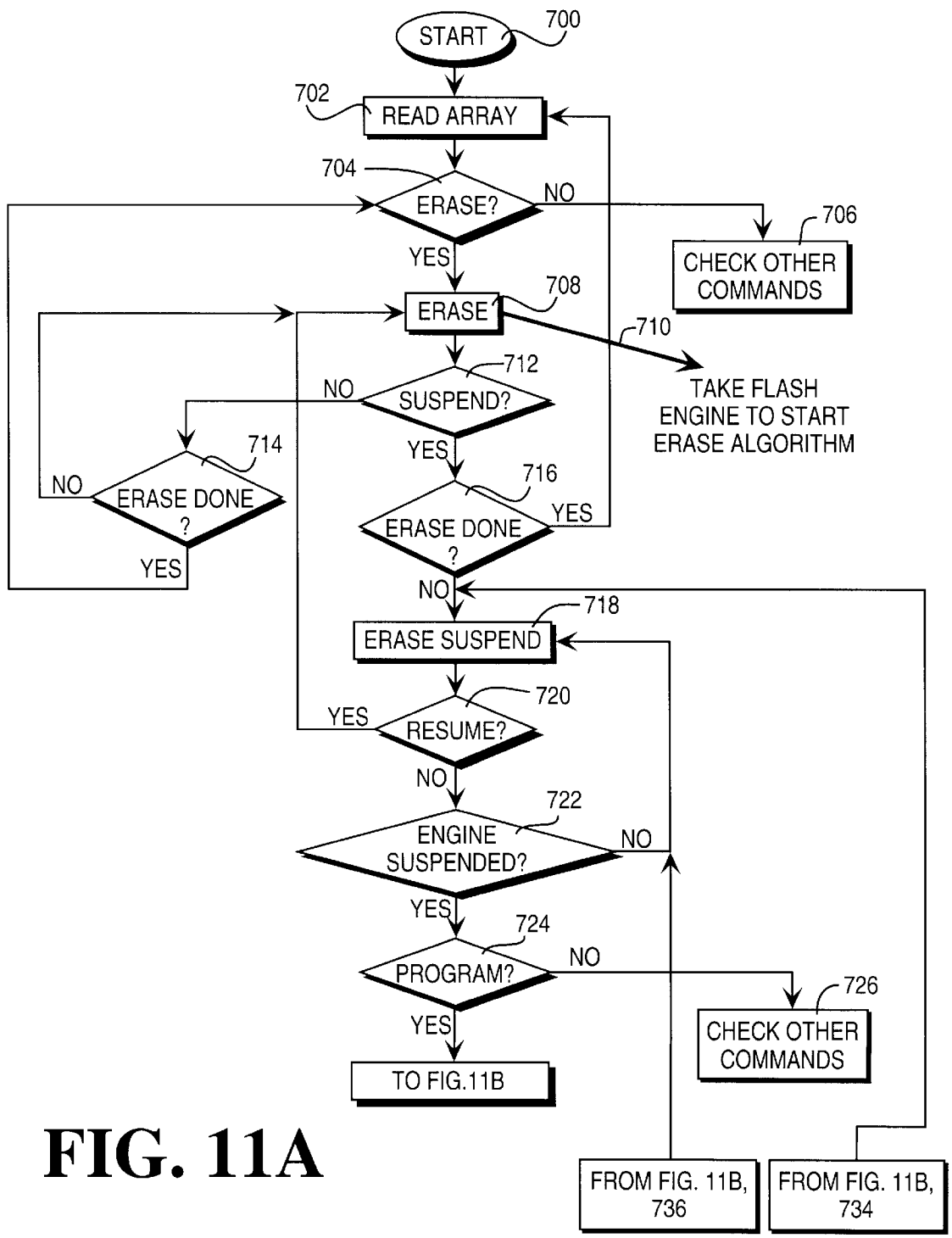
FIGS. 11A and 11B are a flowchart showing the algorithm that controls the command decoder user interface operation allowing for nested operations.
Figure 11B:
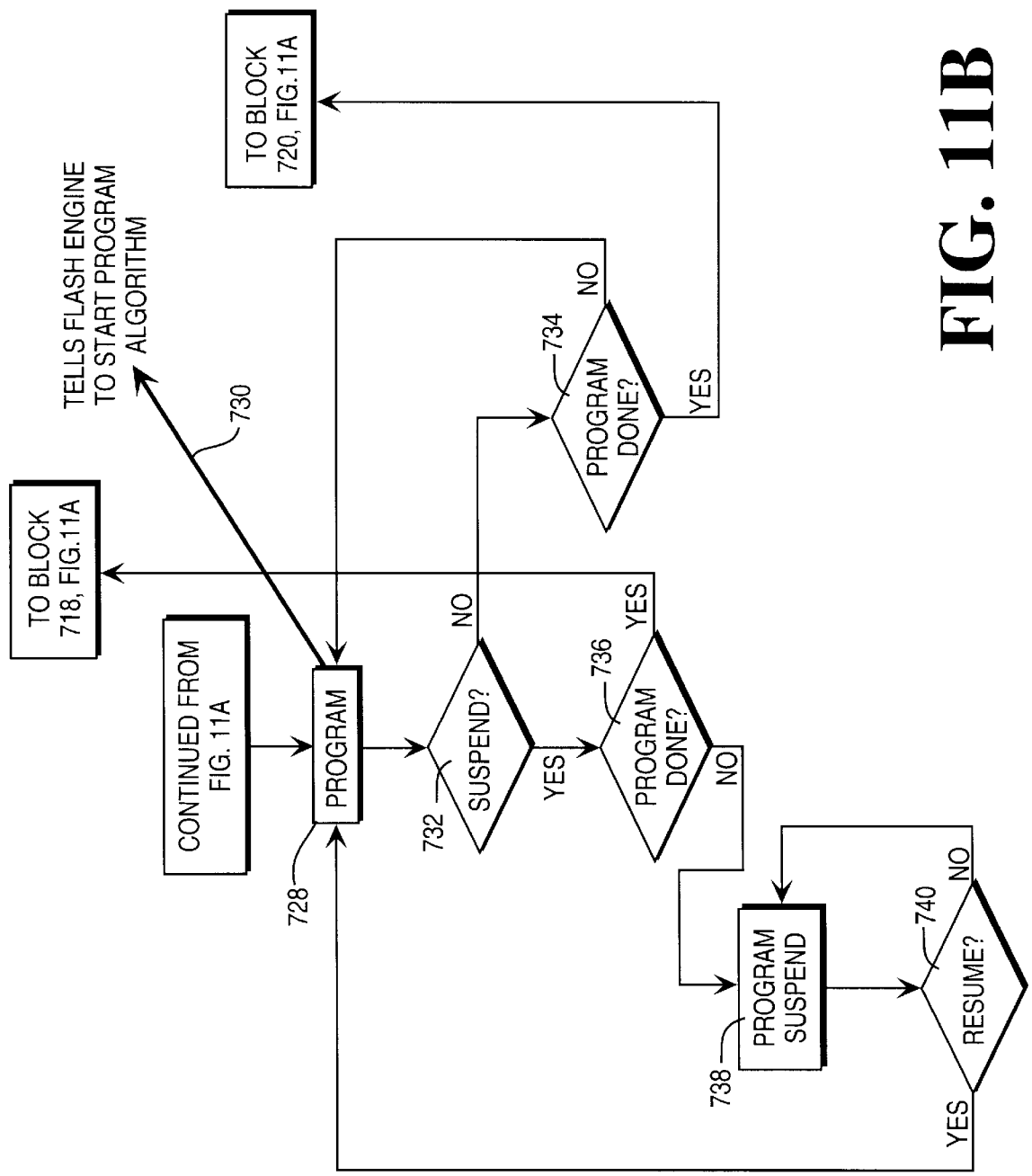

Conflict resolution is implemented in one embodiment using two algorithms. One algorithm controls command decoder user interface operation, and the other algorithm controls write state machine operation. FIGS. 11A and 11B are a flowchart showing the algorithm which controls command decoder user interface operation allowing for nested operations. The flowchart starts at block 700. Operation continues at block 702 at which the command decoder reads a data array input to the command decoder as a result of user commands. At block 704, the command decoder determines if an erase command was received. If no erase command was received, the command decoder checks for other commands at block 706. If an erase command was received then operation continues at block 708, at which an erase signal is asserted. The erase signal 710 tells the write state machine to begin executing the erase algorithm.

With the erase algorithm execution in progress, operation continues at block 712, at which the command decoder polls for a suspend command. If no suspend command is detected, operation continues at block 714, at which the command decoder polls to see if erase algorithm execution is complete. If erase algorithm execution is complete then the command decoder returns operation to block 704 to determine if an erase command was received. If erase algorithm execution is not complete then the command decoder returns operation to block 708 at which an erase signal 710 signals the write state machine to begin executing the erase algorithm.

If a suspend command was detected at block 712, operation continues at block 716, at which the command decoder polls to see if the erase algorithm execution is complete. If erase algorithm execution is complete, then the command decoder returns operation to block 702 where the command decoder reads an input array for a new instruction. If erase algorithm execution is not complete then, in block 718, the command decoder suspends erase algorithm execution.

Following suspension of erase algorithm execution, operation continues at block 720, at which the command decoder polls for a resume command. The flowchart dictates that the only operation that can be resumed at this point is the suspended erase algorithm. If a resume command is detected, then the command decoder returns operation to block 708 thereby directing the write state machine to execute the erase algorithm. If a resume command is not detected, then operation continues at block 722, at which the command decoder polls to determine if operation of the write state machine is suspended. If operation of the write state machine is not suspended, then operation continues at block 718, at which the command decoder issues a signal suspending erase algorithm execution. If operation of the write state machine is suspended, then the command decoder polls for a program command at block 724.

If the command decoder does not detect a program command, operation continues at block 726, at which the command decoder checks for other commands. If the command decoder detects a program command, operation continues at block 728. At block 728, if a program command was received, then a program signal is asserted. The program signal 730 causes the write state machine to begin executing the program algorithm.

Operation continues at block 732, at which the command decoder polls for a suspend command. If no suspend command is detected, operation continues at block 734, at which the command decoder polls to see if execution of the program algorithm is complete. If program algorithm execution is complete, then the command decoder returns operation to block 720, at which the command decoder polls for a resume command for the previous suspended operation, the erase algorithm. If execution of the program algorithm is not complete, then the command decoder returns operation to block 728 thereby signaling the write state machine to execute the program algorithm.

If a suspend command is detected at block 732, operation continues at block 736, at which the command decoder polls to determine if the execution of the program algorithm is complete. If program algorithm execution is complete, then the command decoder returns operation to block 718, at which the command decoder issues suspends the erase algorithm. If program algorithm execution is not complete, then the command decoder issues a signal, at block 738, suspending execution of the program algorithm. Operation continues at block 740, at which the command decoder polls for a resume command. The flowchart dictates that the only operation that can be resumed is the suspended program algorithm. If a resume command is detected, then the command decoder returns operation to block 728, thereby signaling the write state machine to execute the program algorithm. If a resume command is not detected, then operation continues at block 738, at which the command decoder continues to suspend execution of the program algorithm. The command decoder continues suspension of the last suspended algorithm until a resume command is detected for that particular algorithm.

Figure 12:
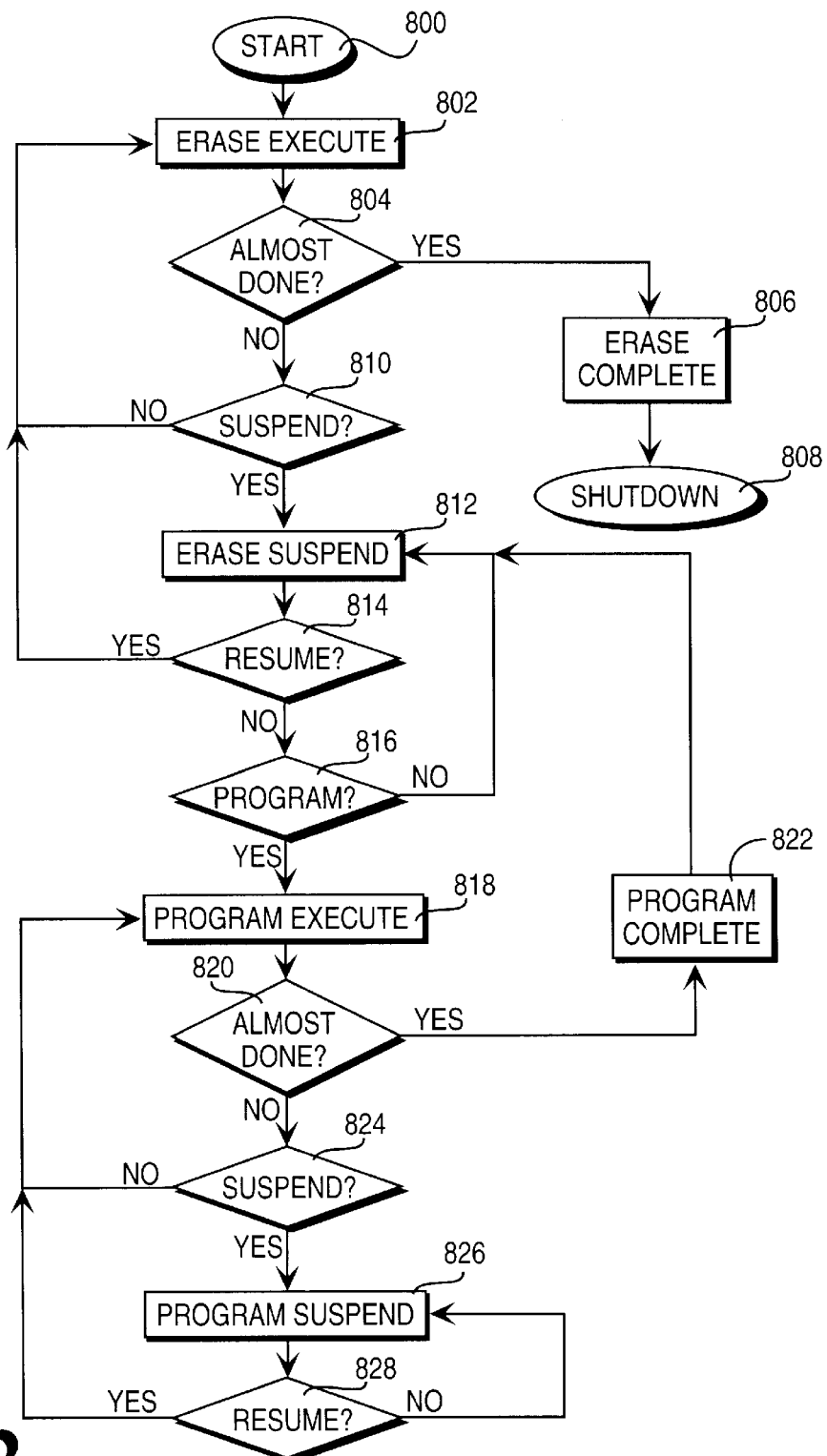
FIG. 12 is a flowchart showing the algorithm that controls the write state machine operation allowing for nested operations.

FIG. 12 is a flowchart showing the algorithm which controls write state machine operation allowing for nested operations. The flowchart starts at block 800. Operation continues at block 802, at which the write state machine begins execution of an erase algorithm. Operation continues at block 804, at which the write state machine determines if execution of the erase algorithm is almost complete. If erase algorithm execution is almost complete, operation continues at block 806, at which erase algorithm execution is completed. Following completion of erase algorithm execution by the write state machine, operation continues at block 808, at which the write state machine shuts down its oscillator.

If erase algorithm execution is not almost complete at block 804, operation continues at block 810, at which the write state machine polls for a suspend command. If no suspend command is detected, then operation continues at block 802, at which the write state machine begins execution of an erase algorithm. If a suspend command is detected, then erase algorithm execution is suspended at block 812.

Following suspension of erase algorithm execution, operation continues at block 814, at which the write state machine polls for a resume command. If a resume command is detected, then operation continues at block 802, at which the write state machine begins execution of an erase operation. If no resume command is detected, then the write state machine polls for a program command at block 816. If no program command is detected at block 816, then operation continues at block 812, at which the erase algorithm remains suspended.

If a program command is detected at block 816, then operation continues at block 818, at which the program algorithm is executed. Operation continues at block 820, at which the write state machine determines if the program algorithm execution is almost complete. If program algorithm execution is almost complete, the program is completed at block 822, and operation continues at block 812, at which erase algorithm execution remains suspended. If program algorithm execution is not almost complete, operation continues at block 824, at which the write state machine polls for a suspend command. If no suspend command is detected, then operation continues at block 818, at which the write state machine begins execution of a program algorithm. If a suspend command is detected at block 824, then program algorithm execution is suspended at block 826.

Following suspension of program algorithm execution at block 826, operation continues at block 828, at which the write state machine polls for a resume command. The flowchart dictates that the only operation that can be resumed at this point is the suspended program execution. If a resume command is detected, then the write state machine returns operation to block 818 thereby directing the write state machine to continue program algorithm execution. If a resume command is not detected at block 828, then operation continues at block 826, at which the write state machine continues to suspend program algorithm execution. The write state machine continues suspension of the last suspended operation until a resume command is detected for this operation.

In the foregoing specification, the invention has been described with reference to specific exemplary embodiments thereof. It will, however be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory comprising:

a memory array;

a command register, wherein the command register comprises a resolution circuit coupled to communicate with a memory array control circuitry, the command register capable of decoding a program suspend command provided to the command register by a plurality of data inputs to the nonvolatile memory, the command register providing a suspend signal as an output; and the memory array control circuitry coupled to receive the suspend signal from the command register, the memory array control circuitry coupled to provide control signals to the memory array to perform a program operation in which data provided to the nonvolatile memory is written to the memory array, the memory array control circuitry suspending the program operation responsive to receiving the suspend signal.

2. The nonvolatile memory of claim 1, wherein the command register further comprises:

a command decoder coupled to receive the plurality of data inputs to the nonvolatile memory, the command decoder providing a decoded program suspend signal at a command decoder output; and a program suspend latch coupled to receive the decoded program suspend signal from the command decoder, the program suspend latch coupled to provide the suspend signal to the memory array control circuitry.

3. The nonvolatile memory of claim 2, wherein the command decoder decodes a program resume command to provide a program resume signal, and the command register further comprises:

a program resume latch coupled to receive the program resume signal from the command decoder, the program resume latch coupled to provide an input to the memory array control circuitry.

4. The nonvolatile memory of claim 3, wherein the resolution circuit controls operation of the memory array control circuitry based on commands provided to the command register by the plurality of data inputs to the nonvolatile memory and based on signals provided by the memory array control circuitry.

5. In a system comprising a processor and a nonvolatile memory coupled to the processor, wherein the nonvolatile memory comprises a command register, the command register comprising a resolution circuit coupled to communicate with memory array control circuitry, a method of reading code from the nonvolatile memory, the method comprising the steps of:

(a) suspending a first non-read operation being performed in the nonvolatile memory;

(b) suspending a second non-read operation being performed in the nonvolatile memory;

(c) providing code from the nonvolatile memory to the processor;

(d) resuming the second non-read operation; and (e) resuming the first non-read operation.

6. The method of claim 5, further comprising the step of:

(f) executing the code by the processor.

7. The method of claim 5, wherein the first non-read operation is a program operation, during which data is written to a memory array within the nonvolatile memory.

8. The method of claim 5, wherein the first non-read operation is an erase operation, during which a block of a memory array within the nonvolatile memory is erased.

9. The method of claim 5, wherein only a suspended operation can be resumed.

10. The method of claim 5, wherein operations are resumed in the reverse order of which the operations are suspended.

11. The method of claim 5, wherein the first non-read operation is suspended and resumed a plurality of times.

12. The method of claim 5, wherein the second non-read operation is suspended and resumed a plurality of times.

13. The method of claim 5, wherein a plurality of second non-read operations is performed before resuming the suspended first non-read operation.

14. The method of claim 5, wherein one of a plurality of non-read operations is performed, suspended, and resumed after resuming and completing the suspended second non-read operation and before resuming the suspended first non-read operation.

15. The method of claim 5, wherein a plurality of non-read operations is performed, suspended, and resumed before resuming the suspended first non-read operation.

16. The method of claim 5, wherein a plurality of non-read operations is performed after resuming and completing the suspended second non-read operation.

* * * * *